United States Patent
Chang et al.

(10) Patent No.: US 8,482,360 B2
(45) Date of Patent: Jul. 9, 2013

(54) RF SWITCH WITH HIGH ISOLATION PERFORMANCE

(75) Inventors: Dong-Pil Chang, Daejon (KR); In-Bok Yom, Daejon (KR)

(73) Assignee: Electronics and Telecommunications Research Institute, Daejon (KR)

( * ) Notice: Subject to any disclaimer, the term of this patent is extended or adjusted under 35 U.S.C. 154(b) by 324 days.

(21) Appl. No.: 12/681,307

(22) PCT Filed: Jun. 26, 2008

(86) PCT No.: PCT/KR2008/003703
§ 371 (c)(1),
(2), (4) Date: Apr. 1, 2010

(87) PCT Pub. No.: WO2009/044989
PCT Pub. Date: Apr. 9, 2009

(65) Prior Publication Data
US 2010/0244985 A1   Sep. 30, 2010

(30) Foreign Application Priority Data
Oct. 1, 2007 (KR) .................. 10-2007-0098738

(51) Int. Cl.
*H01P 1/10* (2006.01)
*H01P 5/12* (2006.01)

(52) U.S. Cl.
USPC ......................... 333/103; 333/104

(58) Field of Classification Search
USPC ................. 333/101, 103, 104, 175
See application file for complete search history.

(56) References Cited

U.S. PATENT DOCUMENTS

| 5,012,123 | A |   | 4/1991  | Ayasli et al. |
| 5,272,457 | A | * | 12/1993 | Heckaman et al. ........... 333/262 |
| 5,990,580 | A | * | 11/1999 | Weigand ........................ 307/125 |
| 7,411,471 | B2 | * | 8/2008  | Tsukahara ..................... 333/104 |
| 7,893,791 | B2 | * | 2/2011  | Ma et al. ....................... 333/104 |
| 2007/0026836 | A1 |   | 2/2007 | Chow et al. |

FOREIGN PATENT DOCUMENTS

| JP | 06-232601 A | 8/1994 |
| JP | 2004-072362 A | 3/2004 |
| KR | 2003-0034641 A | 5/2003 |
| KR | 10-0611107 B1 * | 8/2006 |
| KR | 10-0611107 B1 | 8/2006 |

OTHER PUBLICATIONS

Nobuaki Imai, Akira Minakawa, and Hiroshi Okazaki "Novel High-Isolation FET Switches" IEEE trans. MTT-s, vol. 44, No. 5, pp. 685-691, 1996.5.

Buber T. et al. "A low-loss high-isolation absorptive GaAs SPDT PIN switch for 24GHz automotive applications" RAWCON, pp. 349-352, 2003.

* cited by examiner

Primary Examiner — Dean O Takaoka
(74) Attorney, Agent, or Firm — Rabin & Berdo, P.C.

(57) ABSTRACT

Provided is a RF switch for switching a path of a RF signal using a semiconductor transistor such as a field effect transistor (FET). The RF switch includes a plurality of resonators connected to a RF transmission line, and at least one of switching elements connected in shunt or in series between the plural of resonators. The plurality of resonators resonate by interacting with the switching elements when the switching elements are shorted or open.

6 Claims, 3 Drawing Sheets

RF SWITCH WITH HIGH ISOLATION PERFORMANCE

TECHNICAL FIELD

The present invention relates to a radio frequency (RF) switch for RF and microwave band communication equipment and parts; and, more particularly, to a RF switch for connecting or disconnecting a path of a RF signal using a semiconductor transistor such as a field effect transistor (FET).

This work was supported by the IT R&D program of MIC/IITA [2007-S-301-01, "Development of Global Navigation Satellite System Ground Station and Search And Rescue Beacon Technologies"].

BACKGROUND ART

A radio frequency (RF) switch generally includes a transistor serially connected to the middle of a transmission line that forms a RF path, or a transistor connected to the middle of a transmission line in shunt. The RF switch connects or disconnects a RF path by controlling ON and OFF states of a transistor using bias of the transistor.

FIGS. 1 and 2 show RF switches according to the related art. Hereinafter a RF switch according to the related art will be described with reference to FIGS. 1 and 2.

FIG. 1 is a RF switch having a field effect transistor (FET) connected to ground in shunt.

As shown in FIG. 1, the RF switch according to the related art includes a transistor Q1 12 connected to a RF transmission line 11 in shunt, a resistor R1 13 connected to a gate terminal of the transistor Q1 12, and a gate control voltage input terminal VG 14 connected to the resistor R1 13. A source terminal of the transistor Q1 12 is grounded. As described above, the RF switch according to the related art connects or disconnects the RF transmission line by opening or closing the transistor using bias of the transistor Q1 12.

The maximum power of the RF switch of FIG. 1 is decided according to a size of the transistor. Therefore, the bigger transistor must be used so that the switch could handle the greater RF power. In this case, the isolation performance of the RF switch may deteriorate.

The RF switch according to the related art has been known as that the isolation performance thereof is decided based on unique characteristics of a transistor and that the isolation performance thereof is constant regardless of frequency increment. However, the RF switch according to the related art was not embodied using only one shunt transistor because the isolation of a shunt transistor is not high enough.

FIG. 2 is a diagram illustrating a RF switch using a serially-connected field effect transistor (FET) according to the related art.

As shown in FIG. 2, the RF switch according to the related art includes a field effect transistor (FET) Q1 21 serially connected to a RF transmission line, a resistor R1 23 connected to a gate terminal of the FET 21, and a gate control voltage input terminal VG1 22.

The RF switch according to the related art connects or disconnects the RF transmission path by opening or closing the transistor using bias of the transistor, as shown in FIG. 2.

In the RF switch according to the related art shown in FIG. 2, the isolation performance of the transistor is decided according to unique characteristic of the transistor, and the isolation performance abruptly decreases according to frequency increment. Also, the RF switch according to the related art provides about 20 dB of isolation performance at 3 GHz. However, the isolation performance of the RF switch according to the related art is not enough at a disconnecting state of the RF switch.

DISCLOSURE OF INVENTION

Technical Problem

An embodiment of the present invention is directed to providing a radio frequency (RF) switch for providing high isolation performance by adding at least one of resonators between transistors in the RF switch that switches a RF signal path by using a semiconductor transistor similar to a field effect transistor (FET).

Other objects and advantages of the present invention can be understood by the following description, and become apparent with reference to the embodiments of the present invention. Also, it is obvious to those skilled in the art of the present invention that the objects and advantages of the present invention can be realized by the means as claimed and combinations thereof.

Technical Solution

In accordance with an aspect of the present invention, there is provided a radio frequency (RF) switch including: a plurality of resonators connected to a RF transmission line; and at least one of switching elements connected between the plural of resonators in shunt, wherein the plurality of resonators resonate by interacting with the switching elements when the switching elements are shorted.

In accordance with another aspect of the present invention, there is provided a radio frequency (RF) switch, including: a plurality of resonators connected to a RF transmission line; and at least one of switching elements connected in series between the plurality of resonators, wherein the plurality of resonators resonate by interacting with the switching elements when the switching elements are open.

The RF switch according to the present invention includes at least one of field effect transistors connected to a RF transmission path in shunt and resonators disposed at the junction connecting the shunt transistors. Therefore, the RF switch according to an embodiment of the present invention has high isolation performance.

The RF switch according to the present invention includes at least one of field effect transistors (FET) connected in series and resonators connected to both ends of the FET. Therefore, the RF switch according to the present invention provides high isolation performance.

In the present invention, the resonator may be formed using a RF transmission line, or the combination of inductor and capacitor, which is equivalent to the transmission line resonator. Preferably, the resonator may be embodied as combination of inductor and capacitor at a low frequency band. Therefore, a size of the RF switch can be reduced, and high isolation performance can be embodied using the transmission line resonator at high frequency band where the length of the transmission line resonator is short.

Advantageous Effects

A RF switch according to an embodiment of the present invention includes at least one of transistors and at least one of resonators. The RF switch provides high isolation performance at a RF band. Furthermore, the number of semiconductor elements such as transistors can be reduced while improving the isolation performance.

BEST MODE FOR CARRYING OUT THE INVENTION

The advantages, features and aspects of the invention will become apparent from the following description of the embodiments with reference to the accompanying drawings, which is set forth hereinafter.

Figure 3:
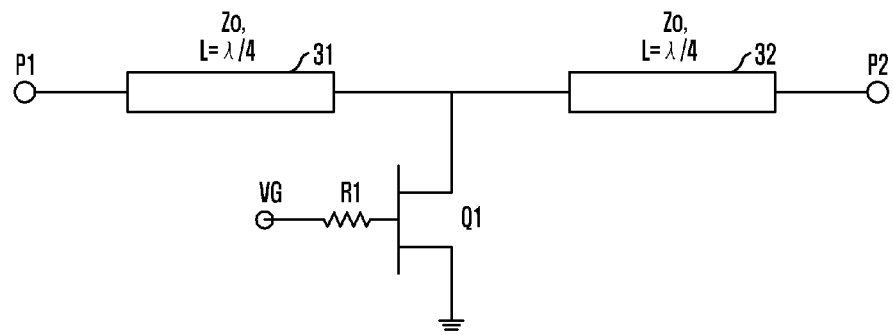
FIGS. 3 and 4 are diagrams illustrating a RF switch in accordance with an embodiment of the present invention.

FIG. 3 is a diagram illustrating a radio frequency (RF) switch having one transistor connected in shunt and two resonators connected to an input end and an output end of the transistor in accordance with an embodiment of the present invention.

As shown in FIG. 3, the RF switch according to the present embodiment includes a transistor Q1 connected to a RF transmission path in shunt, and resonators 31 and 32 connected to an input end and an output end of the transistor Q1.

The RF switch according to the present embodiment forms an open circuit between the input end and the output end by the resonators 31 and 32 when the transistor is shorted. Therefore, insertion loss increases. Also, the RF switch according to the present embodiment has high isolation performance at around a resonant frequency of the resonator because the resonators resonate by interacting with the transistor.

The resonators 31 and 32 may be embodied using a microstrip transmission line, an inductor-capacitor circuit, or the combination of a microstrip transmission line and an inductor-capacitor circuit according to a frequency band or a size of a RF switch.

Figure 1:
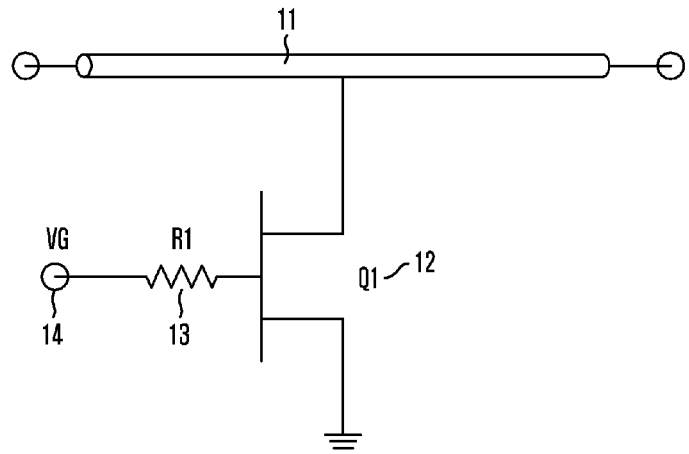
FIGS. 1 and 2 are diagrams illustrating conventional RF switches according to the related art.
Figure 5:
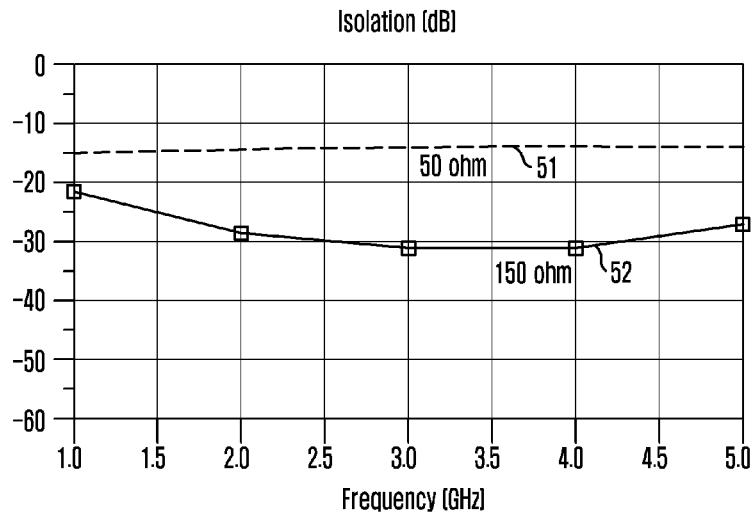
FIGS. 5 and 6 are graphs showing simulation results of RF switches in accordance with an embodiment of the present invention which are shown in FIGS. 3 and 4, respectively.

FIG. 5 is a graph showing characteristics of a RF switch of FIG. 1 and a RF switch of FIG. 3.

Referring to FIG. 5, a first curve 51 denotes isolation characteristic of a conventional RF switch having shunt transistor shown in FIG. 1 according to the related art, and a second curve 52 denotes isolation characteristics of a RF switch having a shunt transistor and two resonators shown in FIG. 3 according to the present invention. The second curve 52 is obtained by simulating a RF switch according to the present embodiment of FIG. 3 with 150 ohm (Ω) as impedance of a transmission line resonator. That is, if the impedance of the transmission line resonator is set to 50 ohm (Ω), the isolation characteristic of the RF switch according to the present embodiment becomes identical to that of the RF switch using one shunt transistor without the transmission line resonator. Therefore, the isolation characteristic can be improved as much as about 17 dB at 3 GHz using the transmission line resonator of high characteristic impedance such as 150 ohm (Ω), compared to the RF switch according to the related art.

Figure 4:
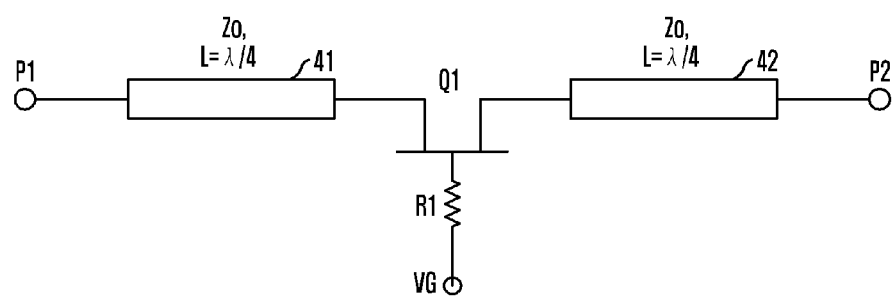

FIG. 4 is a diagram illustrating a RF switch in accordance with another embodiment of the present invention. As shown in FIG. 4, two resonators 41 and 42 are added to the RF switch having a serially connected transistor according to the related art.

As shown in FIG. 4, the RF switch according to another embodiment includes a serially connected one transistor Q1 and resonators 41 and 42 connected to an input end and an output end of the transistor Q1. The RF switch according to another embodiment provides high isolation performance at around resonant frequency of the resonators.

Figure 2:
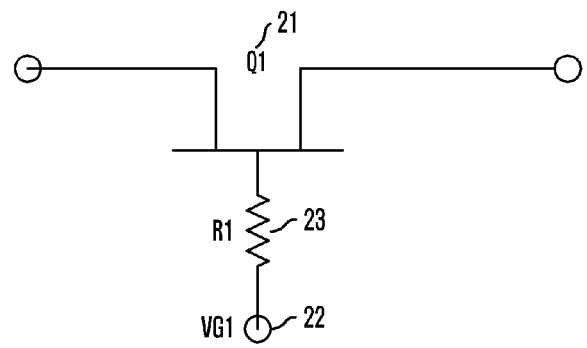
Figure 6:
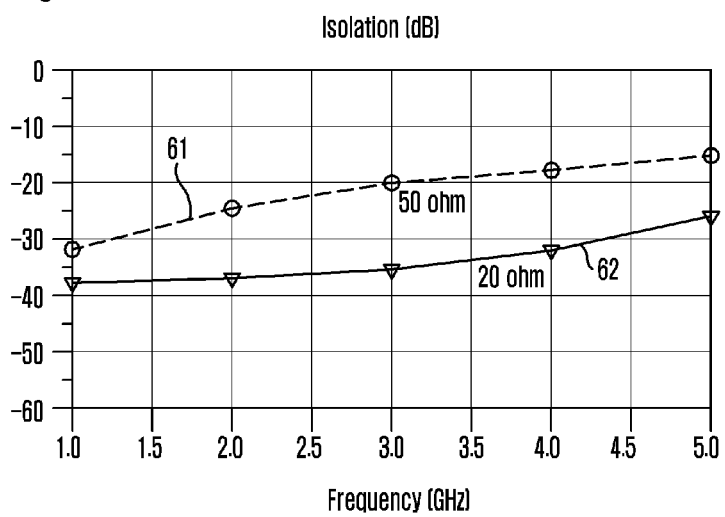

FIG. 6 is a graph illustrating characteristics of a RF switch of FIG. 2 and a RF switch of FIG. 4.

In FIG. 6, a first curve 61 shows isolation characteristics of a conventional RF switch using a serially connected transistor according to the related art, and a second curve 62 denotes isolation characteristics of a RF switch having one serially connected transistor and two resonators according to the present invention.

The second curve 62 is obtained by simulating the RF switch according to the present embodiment with 20 ohm (Ω) as impedance of a transmission line resonator. That is, if the impedance of the transmission line resonator is set to 50 ohm (Ω), the isolation characteristic of the RF switch according to the present embodiment becomes identical to that of the RF switch using one serially connected transistor without the transmission line resonator. Therefore, the isolation characteristic can be improved as much as about 17 dB at 3 GHz using the transmission line resonator of low characteristic impedance such as 20 ohm (Ω), compared to the RF switch according to the related art.

Figure 7:
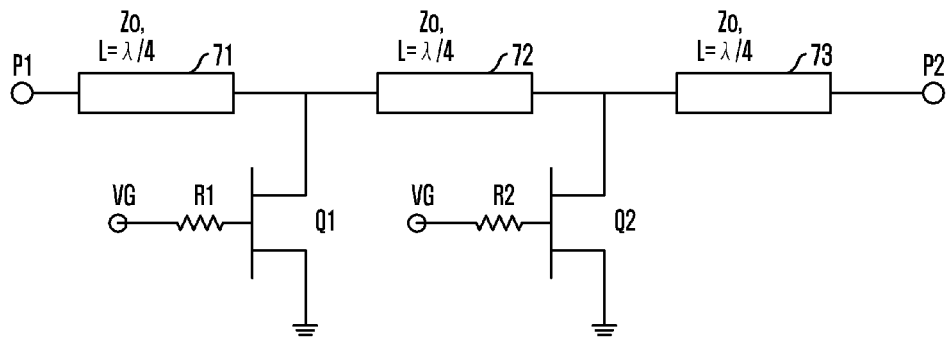
FIG. 7 is a diagram illustrating a RF switch having a plurality of shunt transistors and a plurality of resonators in accordance with an embodiment of the present invention.

FIG. 7 is a diagram illustrating a RF switch in accordance with an embodiment of the present invention. The RF switch of FIG. 7 has an expanded structure of the RF switch shown in FIG. 3.

As shown in FIG. 7, a RF switch according to the present embodiment includes two shunt transistors Q1 and Q2 and three transmission line resonators 71, 72, and 73. In other words, the RF switch according to the present embodiment includes first to third resonators 71, 72, and 73 connected to a transmission path, a transistor Q1 connected between a first resonator 71 and a second resonator 72 in shunt, and a transistor Q2 connected between the second resonator 72 and the third resonator 73 in shunt.

Figure 8:
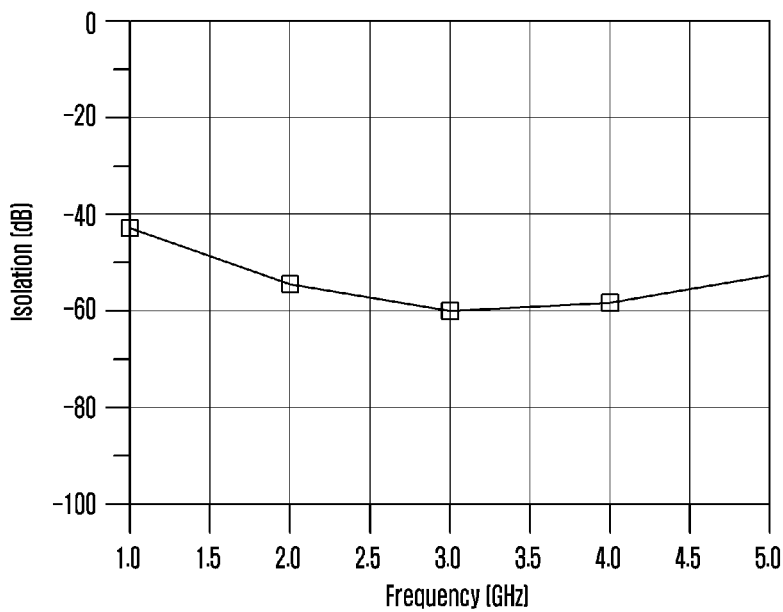
FIG. 8 is a graph showing a simulation result of the RF switch shown in FIG. 7.

As shown in FIG. 7, the RF switch according to the present embodiment provides further improved isolation performance by expanding the switching structure shown in FIG. 3. FIG. 8 shows a simulation result of the RF switch shown in FIG. 7.

As shown in FIG. 8, the RF switch using a plural of shunt transistors and resonators shown in FIG. 7 has isolation characteristics improved as much as about 29 dB compared to the RF switch having single shunt transistor and a resonator shown in FIG. 3. The graph of FIG. 8 clearly shows that RF switch of FIG. 7 has characteristics almost identical to two of the RF switches of FIG. 3 connected in two stages.

Figure 9:
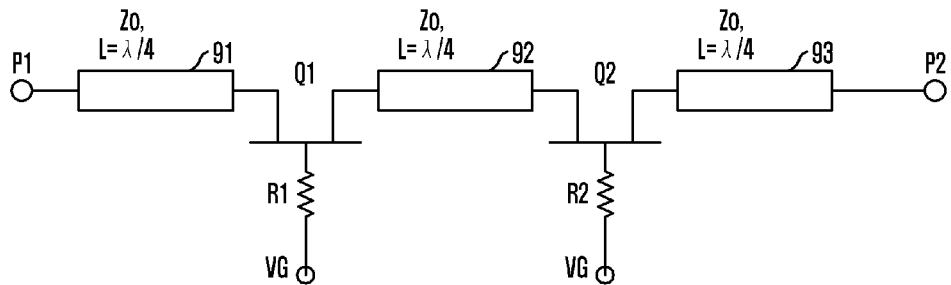
FIG. 9 is a diagram illustrating a RF switch having a plurality of series transistors and a plurality of resonators in accordance with another embodiment of the present invention.

FIG. 9 is a diagram illustrating a RF switch having two serially connected transistors and three resonators in accordance with another embodiment of the present invention.

As shown in FIG. 9, the RF switch according to another embodiment includes an expanded structure of the RF switch shown in FIG. 4 for providing further improved isolation performance. That is, the RF switch according to another embodiment includes first to third resonators 91, 92, and 93 connected on a RF transmission path, a first transistor Q1 serially connected between the first resonator 91 and the second resonator 92, and a second transistor Q2 serially connected between the second resonator 92 and the third resonator 93.

Figure 10:
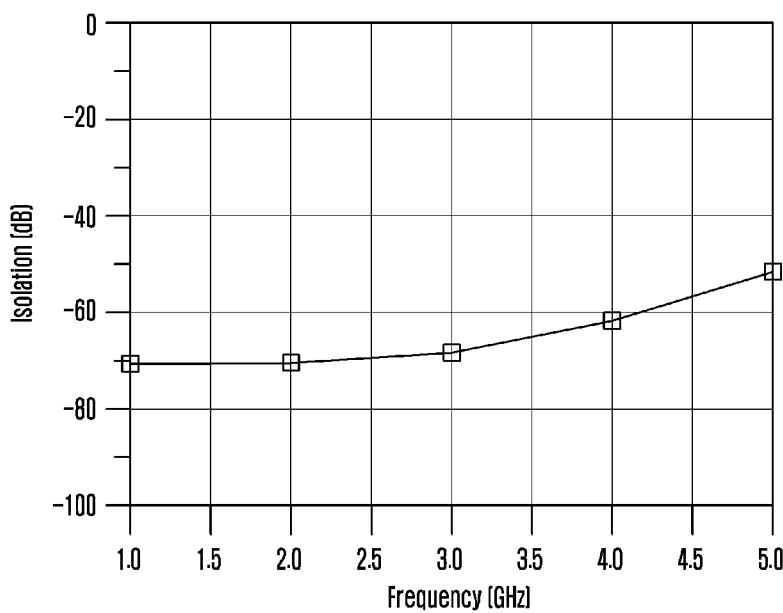
FIG. 10 shows a simulation result of the RF switch shown in FIG. 9.

FIG. 10 shows a simulation result of the RF switch shown in FIG. 9.

Referring to FIG. 10, the RF switch including a plurality of serially connected transistors and a plurality of resonators has isolation performance improved as much as about 35 dB compared to the RF switch having the single serially connected transistor and resonator shown in FIG. 4. The graph of FIG. 10 clearly shows that RF switch of FIG. 9 has characteristics almost identical to two of the RF switches of FIG. 4 connected in two stages.

Specifications of a field effect transistor (FET) used for the simulations are as follows.

Gate length—0.15 um
The number of fingers—4
Gate width—200 um
GaAs PHEMT of NGST As described above, the RF switch according to the present embodiment using the FET as a switching element was described. However, it is obvious to those skilled in the art that the present invention may be identically applied to a RF switch having different semiconductor elements such as a diode in order to improve isolation performance using a transmission line resonator or a resonator formed of inductor and capacitor, which is equivalent thereto.

The present application contains subject matter related to Korean Patent Application No. 10-2007-0098738, filed in the Korean Intellectual Property Office on Oct. 1, 2007, the entire contents of which are incorporated herein by reference.

While the present invention has been described with respect to the specific embodiments, it will be apparent to those skilled in the art that various changes and modifications may be made without departing from the spirit and scope of the invention as defined in the following claims.

The invention claimed is:

1. A radio frequency (RF) switch, comprising:
   a plurality of resonators connected to an RF transmission line; and
   at least one of switching elements having a first terminal, a second terminal and a gate, wherein the first terminal is connected to a first resonator of the plurality of resonators and the second terminal is connected to a second resonator of the plurality of resonators, and the gate is connected to a gate voltage, and wherein the plurality of resonators resonate by interacting with the at least one of the switching elements when the at least one of the switching elements is open,
   wherein the plurality of resonators have a characteristic impedance that causes the RF switch to have an isolation characteristic substantially enhanced from an isolation characteristic of an RF switch having a single series transistor and no resonators.

2. The RF switch of claim 1, wherein at least one of the plurality of resonators is formed using a microstrip transmission line.

3. The RF switch of claim 1, wherein at least one of the plurality of resonators is formed using an inductor-capacitor circuit.

4. The RF switch of claim 1, wherein at least one of the plurality of resonators is formed as a combination of a microstrip transmission line and an inductor-capacitor circuit.

5. The RF switch of claim 1, wherein the switching element includes a field effect transistor.

6. The RF switch of claim 1, wherein the switching element is includes a diode.

* * * * *